(12) United States Patent
Lu et al.

(10) Patent No.: US 8,912,938 B1
(45) Date of Patent: Dec. 16, 2014

(54) CONVERTER AND METHOD OF CONTROLLING THE SAME

(71) Applicant: Delta Electronics (Shanghai) Co., Ltd., Shanghai (CN)

(72) Inventors: Hao Lu, Shanghai (CN); Kuang Sheng, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/166,829

(22) Filed: Jan. 28, 2014

(30) Foreign Application Priority Data

Oct. 15, 2013 (CN) .......................... 2013 1 0483013

(51) Int. Cl.
| | |
|---|---|
| *H03M 1/66* | (2006.01) |
| *H03M 1/06* | (2006.01) |
| *H02M 3/156* | (2006.01) |
| *H03M 1/74* | (2006.01) |
| *H02M 3/158* | (2006.01) |
| *H02M 3/157* | (2006.01) |

(52) U.S. Cl.
CPC *H03M 1/06* (2013.01); *H03M 1/66* (2013.01); *H02M 3/156* (2013.01); *H03M 1/747* (2013.01); *H02M 3/1588* (2013.01); *H02M 3/157* (2013.01)

USPC .......................................... 341/144; 323/284

(58) Field of Classification Search
CPC ......... H03M 1/06; H03M 1/66; H03M 1/747; H02M 3/156; H02M 3/1588; H02M 3/157
USPC .......... 341/144; 323/284, 282, 283, 285, 271, 323/304
See application file for complete search history.

(56) References Cited

U.S. PATENT DOCUMENTS 8,278,899 B2 * 10/2012 Schafmeister et al. ....... 323/283

* cited by examiner

*Primary Examiner* — Joseph Lauture
(74) *Attorney, Agent, or Firm* — CKC & Partners Co., Ltd.

(57) ABSTRACT

A converter and a method for controlling a converter are disclosed herein, in which the converter includes a converting circuit, a current sensing circuit, a digital-to-analog converting circuit, a slope compensation circuit and a comparator circuit. The slope compensation circuit is independent from the digital-to-analog converting circuit, and the slope compensation circuit exclusively generates an analog slope compensation signal. The comparator circuit compares an analog signal generated by the digital-to-analog converting circuit with the superimposition of the analog slope compensation signal and a current sensing signal generated by the current sensing circuit or compares the current sensing signal with the superimposition of the analog slope compensation signal and the analog signal to generate a comparator output signal for a control operation of the converting circuit.

20 Claims, 7 Drawing Sheets

CONVERTER AND METHOD OF CONTROLLING THE SAME

RELATED APPLICATIONS

This application claims priority to Chinese Application Serial Number 201310483013.4, filed Oct. 15, 2013, which is herein incorporated by reference.

BACKGROUND

1. Technical Field

The present disclosure relates to a converter. More particularly, the present disclosure relates to a converter having a slope compensation circuit.

2. Description of Related Art

With fast developments of power electronics technology, switched-mode converters have been widely used in various applications. In the mean time, there have been increasing demands for converters with better performance. Among control techniques for converters, digital control techniques are easy to be realized in advanced control designs and adaptive to various control topologies, and thus the digital control techniques can improve control operations of the converters, reduce the number of elements in circuit designs, shrink layout areas of control circuits, and enhance reliabilities of the converters.

Among the digital control techniques, the operation of peak-current mode control has advantages such as improving dynamic characteristics and preventing over-current in the converters and also can be utilized to avoid transformer saturation in bridge converters and push-pull converters, and thus it has been widely used in switched-mode converters. However, the operation of the peak-current mode control suffers from the existence of sub-harmonic oscillations, and a slope compensation is introduced into the peak-current mode control in order to reduce the sub-harmonic oscillations.

In conventional digital control operation, there is a digital controller configured for controlling the converter, and the digital controller includes a digital-to-analog converter (DAC) with slope compensation function. However, since the slope compensation in the DAC is implemented with a slope compensation signal having a staircase waveform, the slope compensation signal having the staircase waveform for the control operation of the converter reduces the stabilization and reliability of whole system.

SUMMARY

In one aspect, the present disclosure relates to a converter. The converter includes a converting circuit, a current sensing circuit, a digital-to-analog converting circuit, a slope compensation circuit and a comparator circuit. The converting circuit is configured for converting an input voltage into an output voltage. The current sensing circuit is configured for sensing an input current corresponding to the input voltage or an output current corresponding to the output voltage to generate a current sensing signal. The digital-to-analog converting circuit is configured for converting a digital signal, which is generated according to the output voltage, into an analog signal. The slope compensation circuit is independent from the digital-to-analog converting circuit, in which the slope compensation circuit is configured for generating an analog slope compensation signal exclusively to be superimposed on the current sensing signal or the analog signal. The comparator circuit is configured for comparing the analog signal with the superimposition of the analog slope compensation signal and the current sensing signal or configured for comparing the current sensing signal with the superimposition of the analog slope compensation signal and the analog signal to generate a comparator output signal for a control operation of the converting circuit.

In another aspect, the present disclosure relates to a converter. The converter includes a converting circuit, a current sensing circuit, a voltage sensing circuit, a digital controller circuit, a digital-to-analog converting integrated circuit, a slope compensation circuit and a comparator circuit. The converting circuit is configured for converting an input voltage into an output voltage. The current sensing circuit is configured for sensing an input current corresponding to the input voltage or an output current corresponding to the output voltage to generate a current sensing signal. The voltage sensing circuit is configured for sensing the output voltage to generate a voltage sensing signal. The digital controller circuit is configured for receiving the voltage sensing signal and generating a digital signal in response to the voltage sensing signal. The digital-to-analog converting integrated circuit is configured for converting the digital signal into an analog signal. The slope compensation circuit is not integrated in the digital-to-analog converting integrated circuit, and the slope compensation circuit is disposed outside the digital controller circuit, in which the slope compensation circuit is configured for generating an analog slope compensation signal exclusively to be superimposed on one of the current sensing signal and the analog signal. And the comparator circuit is configured for comparing the analog signal with the superimposition of the analog slope compensation signal and the current sensing signal or configured for comparing the current sensing signal with the superimposition of the analog slope compensation signal and the analog signal to generate a comparator output signal for a control operation of the converting circuit.

In yet another aspect, the present disclosure relates to a method of controlling a converter for converting an input voltage into an output voltage by a control operation of a converting circuit. The method includes: sensing an input current corresponding to the input voltage or an output current corresponding to the output voltage to generate a current sensing signal; generating a digital signal by a digital controller circuit according to a voltage sensing signal corresponding to the output voltage; converting the digital signal into an analog signal by a digital-to-analog converting integrated circuit; exclusively generating an analog slope compensation signal by a slope compensation circuit independent from the digital-to-analog converting integrated circuit; superimposing the analog slope compensation signal on the current sensing signal or superimposing the analog slope compensation signal on the analog signal; and comparing the analog signal with the superimposition of the current sensing signal and the analog slope compensation signal or comparing the current sensing signal with the superimposition of the analog signal and the analog slope compensation signal to generate a comparator output signal by a comparator circuit for a control operation of the converting circuit.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples anywhere in this specification, including examples of any terms discussed herein, is illustrative only, and in no way limits the scope and meaning of the disclosure or of any exemplified term. Likewise, the present disclosure is not limited to various embodiments given in this specification.

As used herein, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

Figure 1:
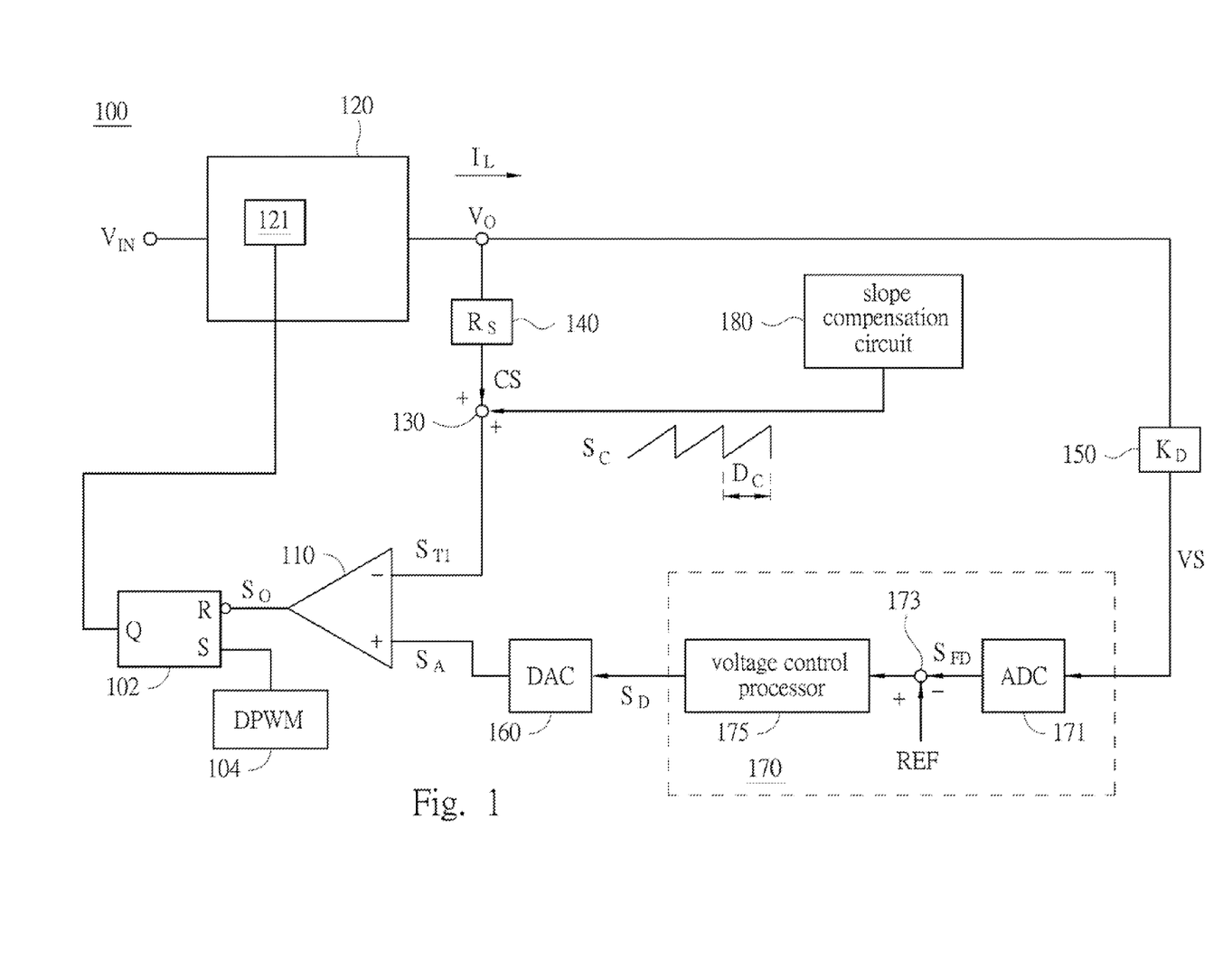
FIG. 1 schematically illustrates a converter according to a first embodiment of the present disclosure.

FIG. 1 schematically illustrates a converter according to a first embodiment of the present disclosure. As shown in FIG. 1, the converter 100 includes a converting circuit 120, a current sensing circuit 140, a digital-to-analog converting (DAC) circuit 160, a slope compensation circuit 180 and a comparator circuit 110. The converting circuit 120 is configured for converting an input voltage $V_{IN}$ into an output voltage $V_O$. The current sensing circuit 140 is configured for sensing an input current corresponding to the input voltage or sensing an output current corresponding to the output voltage to generate a current sensing signal. In the present embodiment, the current sensing circuit 140 is configured for sensing an output current $I_L$ corresponding to the output voltage $V_O$ to generate a current sensing signal CS. The digital-to-analog converting circuit 160 is configured for converting a digital signal $S_D$, which is generated according to the output voltage $V_O$, into an analog signal $S_A$. The slope compensation circuit 180 is independent from the digital-to-analog converting circuit 160, and the slope compensation circuit 180 is configured for generating an analog slope compensation signal $S_C$ exclusively to be superimposed on the current sensing signal CS. The comparator circuit 110 is configured for comparing the analog signal $S_A$ with the superimposition of the analog slope compensation signal $S_C$ and the current sensing signal CS, i.e., a superimposition signal $S_{T1}$, to generate a comparator output signal $S_O$ for a control operation of the converting circuit 120.

Since the slope compensation circuit 180 is independent from the digital-to-analog converting circuit 160 and generates the analog slope compensation signal $S_C$ exclusively to be superimposed on the current sensing signal CS in order for the control operation of the converting circuit 120, the slope compensation circuit 180 need not be integrated with the digital-to-analog converting circuit 160, and the slope compensation circuit 180 can operate independently to generate the analog slope compensation signal $S_C$ having a smooth waveform instead of a staircase waveform, and thus the stabilization and reliability of the converter 100 or a whole system utilizing the converter 100 can be improved.

In practice, for the arrangement of the current sensing circuit 140 and the converting circuit 120, the current sensing circuit 140 may be disposed in the converting circuit 120 as shown in FIG. 1 or outside the converting circuit 120, and thus the arrangement of the current sensing circuit 140 and the converting circuit 120 is not limited to that shown in FIG. 1. In one embodiment, the converting circuit 120 may include non-isolated converting circuits (e.g., buck converting circuits, boost converting circuits, buck-boost converting circuits, synchronous rectification converting circuits, diode-rectification converting circuits, Cuk converting circuits, etc.). In another embodiment, the converting circuit 120 may include isolated converting circuits (e.g., push-pull converting circuits, half-bridge converting circuits, full-bridge converting circuits, fly-back converting circuits, synchronous rectification converting circuit, diode-rectification converting circuit, etc.).

Figure 2A:
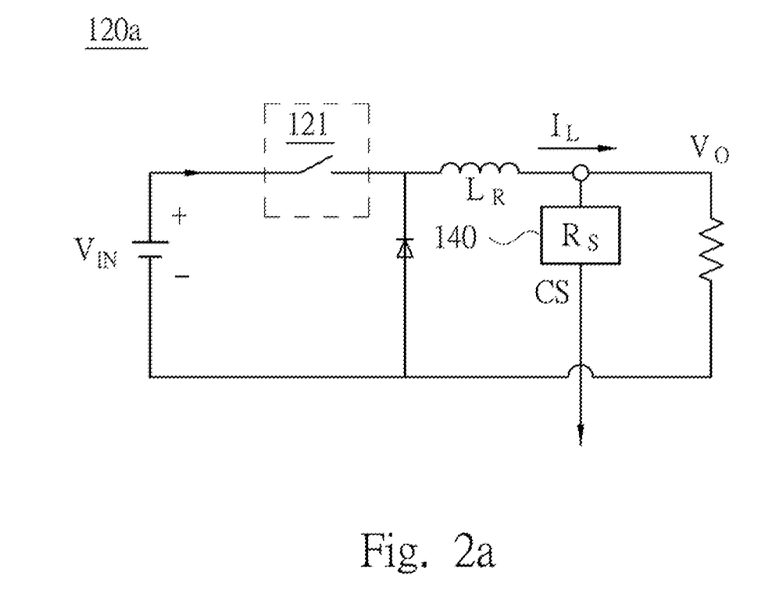
FIG. 2a schematically illustrates a converting circuit according to an embodiment of the present disclosure.
Figure 2B:
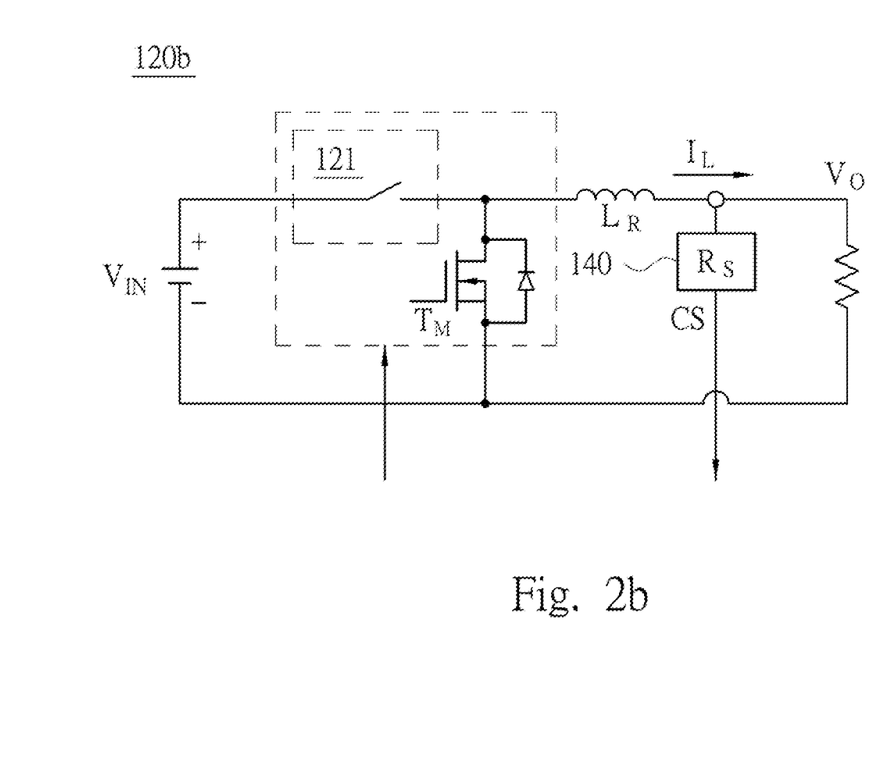
FIG. 2b schematically illustrates a converting circuit according to another embodiment of the present disclosure.

FIG. 2a schematically illustrates a converting circuit according to an embodiment of the present disclosure. As shown in FIG. 2a, the converting circuit 120a is a non-isolated buck converting circuit. Further, the converting circuit 120a may be a buck circuit having a switch 121. The switch 12 can be a transistor, but it is not limited thereto. Moreover, FIG. 2b schematically illustrates a converting circuit according to another embodiment of the present disclosure. As shown in FIG. 2, the converting circuit 120b may be a synchronous rectification converting circuit, but it is not limited thereto. The converting circuit 120b may be other synchronous rectification topology. The converting circuit 120b includes a transistor TM rather than a diode in the converting circuit 120a. In the present embodiment, the driving signal to the transistor TM may be a complementary signal to the switch 120, but it is not limited thereto. The converting circuit 120a shown in FIG. 2a or the converting circuit 120b shown in FIG. 2b may be applied in the converter 100 shown in FIG. 1 and other converters in the following embodiments, but it is not limited thereto.

In one embodiment, the converter 100 may further include a digital controller circuit 170. The digital controller circuit 170 is configured for receiving a voltage sensing signal VS corresponding to the output voltage $V_O$ and generating the digital signal $S_D$ in response to the voltage sensing signal VS. The digital controller circuit 170 may further include an analog-to-digital converting (ADC) circuit 171, a digital subtracting circuit 173 and a voltage control processor 175. The analog-to-digital converting circuit 171 is configured for converting the voltage sensing signal VS into a digital feedback signal $S_{FD}$. The digital subtracting circuit 173 is configured for subtracting the digital feedback signal $S_{FD}$ from a reference signal REF. The voltage control processor 175 is configured for generating the digital signal $S_D$ according to an operation signal. The operation signal is indicated by subtracting the digital feedback signal $S_{FD}$ from the reference signal REF.

In the present embodiment, the converter 110 may further include a voltage sensing circuit 150. The voltage sensing circuit 150 is configured for sensing the output voltage $V_O$ to generate the voltage sensing signal VS as a feedback signal for the digital controller circuit 170.

In one embodiment, the slope compensation circuit 180 is disposed outside the digital controller circuit 170 as shown in FIG. 1. In the other embodiment, the slope compensation circuit 180 is disposed in the digital controller circuit 170. Persons of ordinary skill in the art may determine the arrangement of the slope compensation circuit 180 according to practical needs.

In one embodiment, at least one of the digital-to-analog converting circuit 160 and the comparator circuit 110 is disposed outside the digital controller circuit 170. In the present embodiment, both of the digital-to-analog converting circuit 160 and the comparator circuit 110 are disposed outside the digital controller circuit 170 as shown in FIG. 1 and, however, it is not limited thereto; that is, the digital-to-analog converting circuit 160 may be disposed outside the digital controller circuit 170 in the condition of the comparator circuit 110 integrated inside the digital controller circuit 170, or the comparator circuit 110 may be disposed outside the digital controller circuit 170 in the condition of the digital-to-analog converting circuit 160 integrated inside the digital controller circuit 170, which is not depicted in FIG. 1.

In one embodiment, the converter 100 may further include a summing circuit 130. The summing circuit 130 is configured for adding the analog slope compensation signal $S_C$ to the current sensing signal CS and generating the superimposition signal $S_{T1}$ for an inverting input (i.e., input "−") of the comparator circuit 110.

In operation, the converting circuit 120 converts the input voltage $V_{IN}$ into the output voltage $V_O$ according to the operation of activating and deactivating the switch 121 with pulse width modulation (PWM) techniques, and the current sensing circuit 140 senses the output current $I_L$ corresponding to the output voltage $V_O$ to generate the current sensing signal CS, in which the current sensing signal CS is superimposed with the analog slope compensation signal $S_C$ exclusively generated by the slope compensation circuit 180 to be the superimposition signal $S_{T1}$ provided for an inverting input (i.e., input "−") of the comparator circuit 110.

Moreover, the voltage sensing circuit 150 senses the output voltage $V_O$ to generate the voltage sensing signal VS as the feedback signal for the analog-to-digital converting circuit 171. The analog-to-digital converting circuit 171 then converts the voltage sensing signal VS into the digital feedback signal $S_{FD}$ to be subtracted from the reference signal REF. The voltage control processor 175 generates the digital signal $S_D$ according to the operation signal which is indicated by subtracting the digital feedback signal $S_{FD}$ from the reference signal REF, in which the digital signal $S_D$ correlating with the output voltage $V_O$ can be calculated, for example, by a proportional-integral-derivative (PID) mechanism. After that, the digital-to-analog converting circuit 160 converts the digital signal $S_D$ into the analog signal $S_A$ provided for a non-inverting input (i.e., input "+") of the comparator circuit 110. The comparator circuit 110 then compares the analog signal $S_A$ with the superimposition signal $S_{T1}$ to generate the comparator output signal $S_O$.

In addition, an SR-latch 102 receives the comparator output signal $S_O$ and a clock signal provided by a digital PWM controller 104 to generate a control signal with a duty cycle for operatively activating and deactivating the switch 121.

Figure 3:
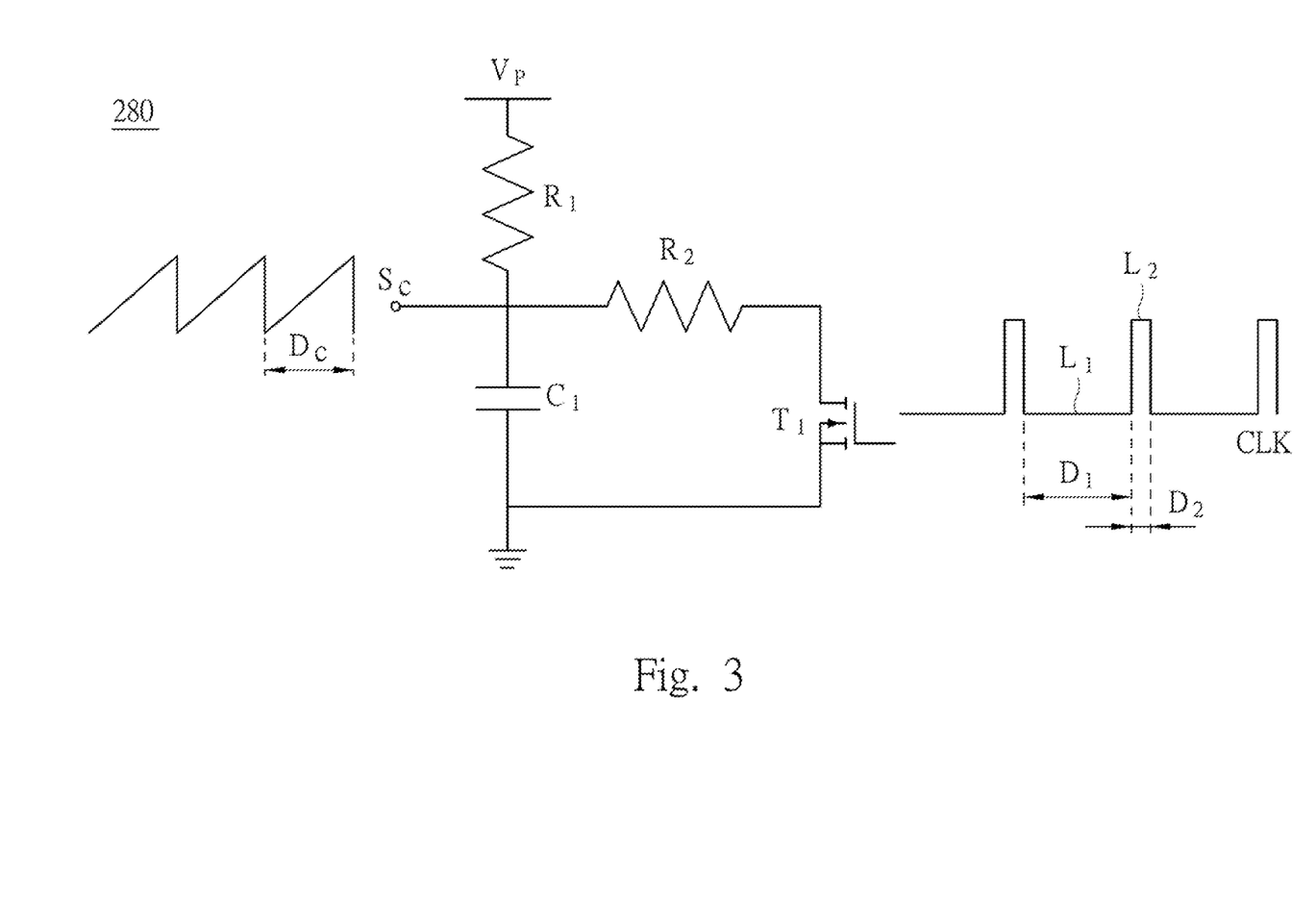
FIG. 3 schematically illustrates a slope compensation circuit according to one embodiment of the present disclosure.

FIG. 3 schematically illustrates a slope compensation circuit according to one embodiment of the present disclosure, in which the slope compensation circuit 280 in FIG. 3 may be applied in the converter 100 shown in FIG. 1 and other converters in the following embodiments, but it is not limited thereto. In the present embodiment, the slope compensation circuit 280 may include a capacitor $C_1$ and a switch $T_1$. The capacitor $C_1$ has a first terminal and a second terminal, in which the first terminal of the capacitor $C_1$ is configured for generating the analog slope compensation signal $S_C$. The switch $T_1$ has a control terminal, a first terminal and a second terminal, in which the control terminal of the switch $T_1$ is configured for receiving a synchronous signal CLK. Further, the slope compensation circuit 280 includes resistors $R_1$ and $R_2$. The resistor $R_1$ has a first terminal and a second terminal, in which the first terminal of the resistor $R_1$ is electrically connected to the first terminal of the capacitor, and the second terminal of the resistor $R_1$ is configured for receiving a power voltage $V_P$. The resistor $R_2$ has a first terminal and a second terminal, in which the first terminal of the resistor $R_2$ is electrically connected to the first terminal of the capacitor $C_1$, and the second terminal of the resistor $R_2$ is electrically connected to the second terminal of the switch $T_1$.

The synchronous signal CLK in FIG. 3 is characterized with a synchronous waveform having a duration $D_1$ and a duration $D_2$ immediately following the duration $D_1$, in which the synchronous waveform in the duration $D_1$ has a level $L_1$ (e.g., 0 Volts), and the synchronous waveform in the duration $D_2$ that is shorter than the duration $D_1$ has a level $L_2$ (e.g., 1.2 Volts) different from the level $L_1$. In operation, the switch $T_1$ is alternately deactivated in the duration $D_1$ and activated in the duration $D_2$, such that the capacitor $C_1$ is charged through the resistor $R_1$ by the power voltage $V_P$ when the synchronous waveform of the synchronous signal CLK is at the level $L_1$ in the duration $D_1$, and the capacitor $C_1$ is discharged through the resistor $R_2$ connected to the switch $T_1$ when the synchronous waveform of the synchronous signal CLK is at the level $L_2$ in the duration $D_2$, to generate the analog slope compensation signal $S_C$ characterized with an analog waveform having a charging duration $D_C$, in which the analog waveform in the duration $D_C$ has a smooth ramp without staircase patterns, to avoid instability of the converter 100. The analog slope compensation signal $S_C$ can be applied in the converter 100 shown in FIG. 1 and other converters in the following embodiments, but it is not limited thereto.

For the aforementioned embodiment, the slope compensation circuit 280 (or the slope compensation circuit 180 shown in FIG. 1) is independent from the digital-to-analog converting circuit 160 shown in FIG. 1, such that the slope compensation circuit 280 can be realized by simple analog circuit designs and the digital-to-analog converting circuit 160 can be easily designed and fabricated with low cost.

Figure 4:
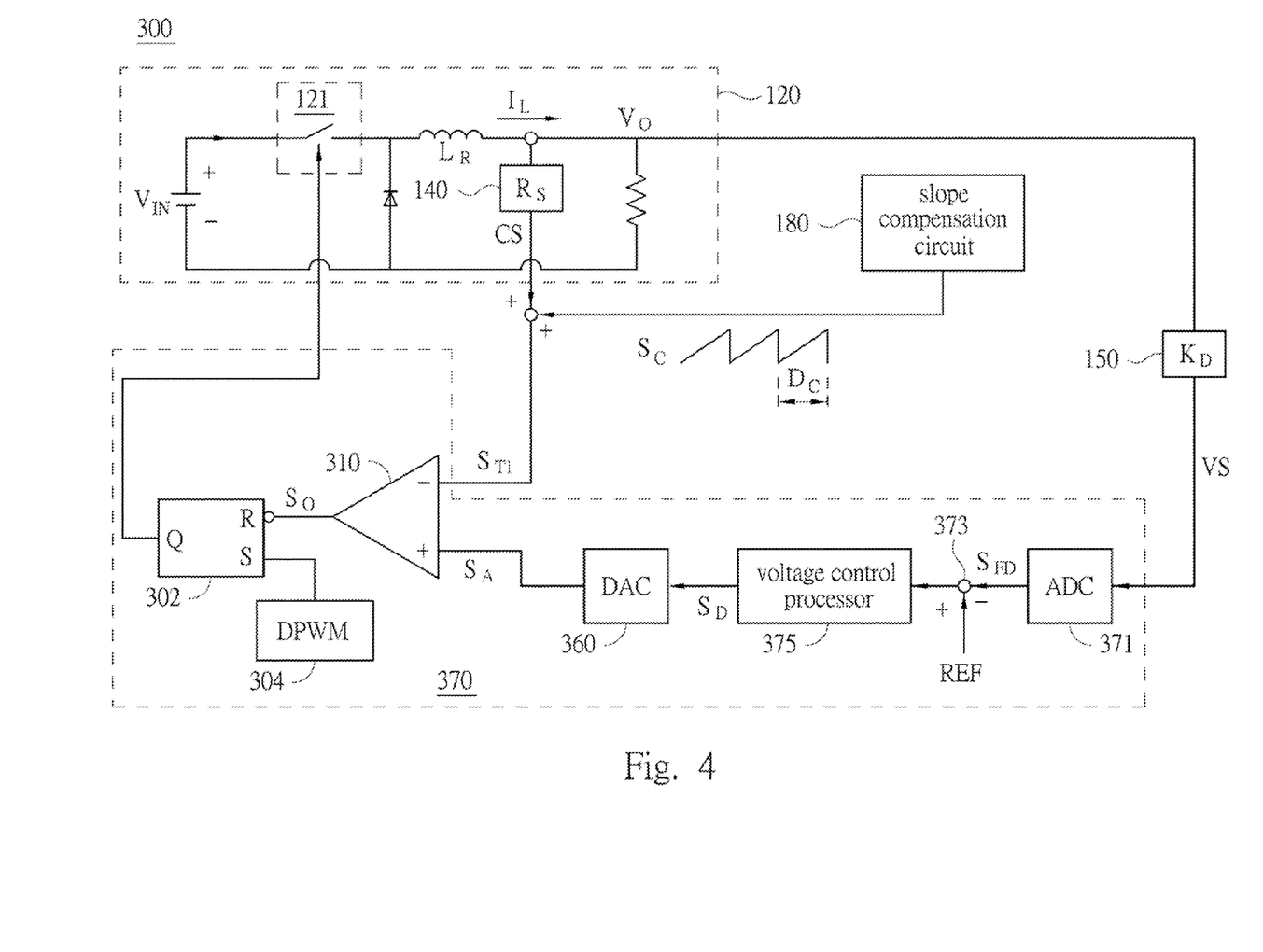
FIG. 4 schematically illustrates a converter according to a second embodiment of the present disclosure.

FIG. 4 schematically illustrates a converter according to a second embodiment of the present disclosure. In comparison with the converter 100 in FIG. 1, the converter 300 in the present embodiment includes circuits similar to those in the converter 100, in which the SR-latch 302, the digital PWM controller 304, the digital-to-analog converting circuit 360, the comparator circuit 310, a analog-to-digital converting circuit 371, a digital subtracting circuit 373 and a voltage control processor 375 are integrated in the digital controller circuit 370. Compared to FIG. 1, the connection and the operation of the converter 300 are similar to those in the aforementioned embodiment in FIG. 1, and thus they are not further detailed herein.

Figure 5:
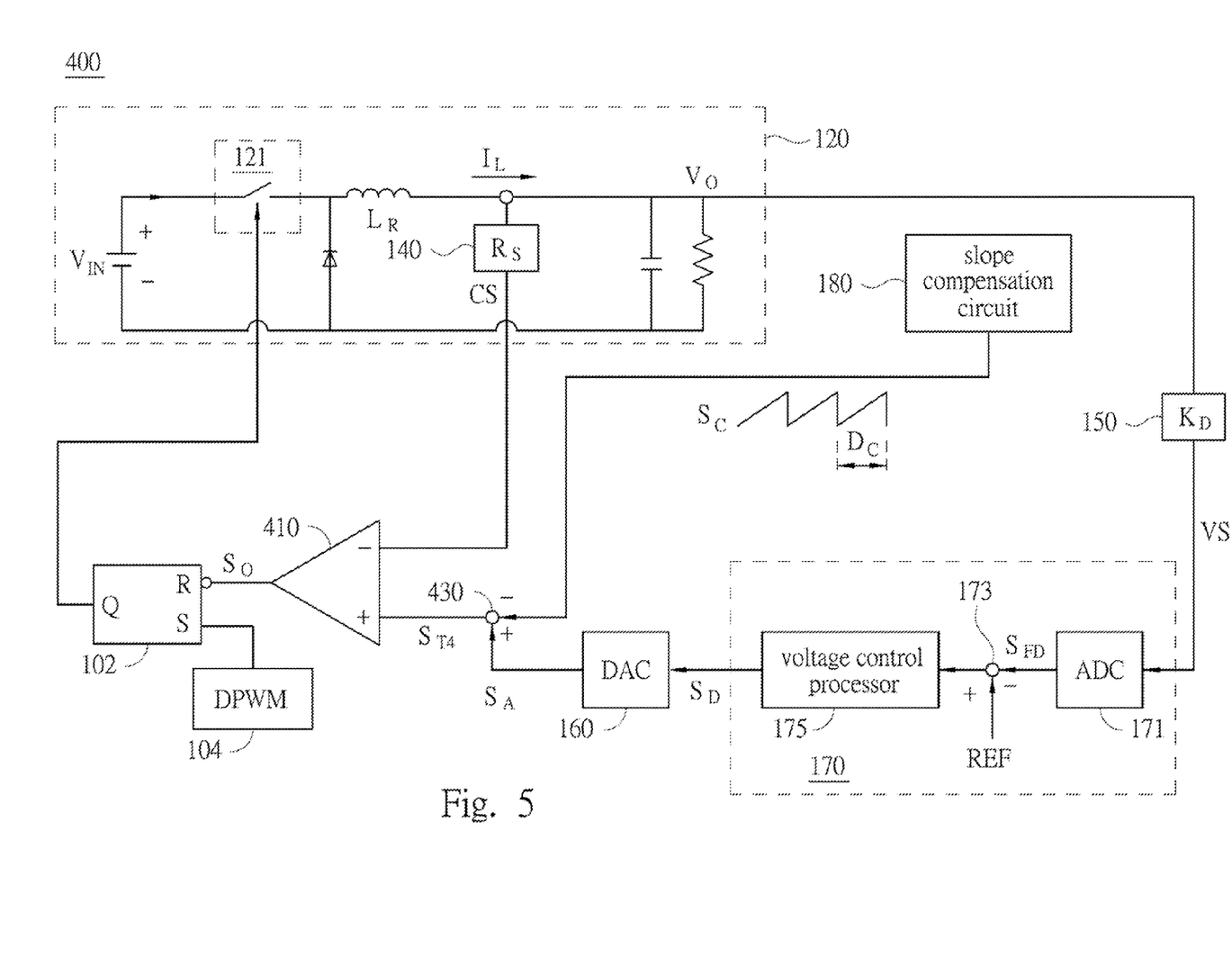
FIG. 5 schematically illustrates a converter according to a third embodiment of the present disclosure.

FIG. 5 schematically illustrates a converter according to a third embodiment of the present disclosure. In comparison with the converter 100 in FIG. 1, the converter 400 in the present embodiment includes circuits similar to those in the converter 100, in which the converter 400 includes a converting circuit 120, a current sensing circuit 140, a digital-to-analog converting (DAC) circuit 160 and a slope compensation circuit 180, except for the comparator circuit 410 configured for comparing the current sensing signal CS with the superimposition of the analog slope compensation signal $S_C$ and the analog signal $S_A$, i.e., a superimposition signal $S_{T4}$, to generate a comparator output signal $S_O$ for a control operation of the converting circuit 120. In addition, the current sensing signal CS is provided for an inverting input "−" of the comparator circuit 410.

In one embodiment, the slope compensation circuit 180 is disposed outside the digital controller circuit 170 as shown in FIG. 5.

In one embodiment, at least one of the digital-to-analog converting circuit 160 and the comparator circuit 410 is disposed outside the digital controller circuit 170. In the present embodiment, both of the digital-to-analog converting circuit 160 and the comparator circuit 410 are disposed outside the digital controller circuit 170 as shown in FIG. 5, but it is not limited thereto; that is, the digital-to-analog converting circuit 160 may be disposed outside the digital controller circuit 170 in the condition of the comparator circuit 410 integrated inside the digital controller circuit 170, or the comparator circuit 410 may be disposed outside the digital controller circuit 170 in the condition of the digital-to-analog converting circuit 160 integrated inside the digital controller circuit 170, which is not depicted in FIG. 5.

In another embodiment, the digital-to-analog converting circuit 160 and the comparator circuit 410 are integrated in the digital controller circuit 170, which is not shown in FIG. 5.

In one embodiment, the converter 400 may further include a subtracting circuit 430. The subtracting circuit 430 is configured for subtracting the analog slope compensation signal $S_C$ from the analog signal $S_A$ and generating the superimposition signal $S_{T4}$ for a non-inverting input "+" of the comparator circuit 410.

In operation, the analog signal $S_A$ is superimposed with the analog slope compensation signal $S_C$ exclusively generated by the slope compensation circuit 180 to be the superimposition signal $S_{T4}$ provided for a non-inverting input (i.e., input "+") of the comparator circuit 410, and the current sensing signal CS is provided for an inverting input (i.e., input "−") of the comparator circuit 410. Compared to FIG. 1, the connection and the operation of the circuit 120, the current sensing circuit 140, the digital-to-analog converting (DAC) circuit 160 and the slope compensation circuit 180 in FIG. 5 are similar to those in the aforementioned embodiment in FIG. 1, and thus they are not further detailed herein. Accordingly, the comparator circuit 410 compares the analog signal $S_A$ with the superimposition signal $S_{T4}$ to generate the comparator output signal $S_O$, and the SR-latch 102 receives the comparator output signal $S_O$ and a clock signal provided by the digital PWM controller 104 to generate the control signal with a duty cycle for operatively activating and deactivating the switch 121.

Figure 6:
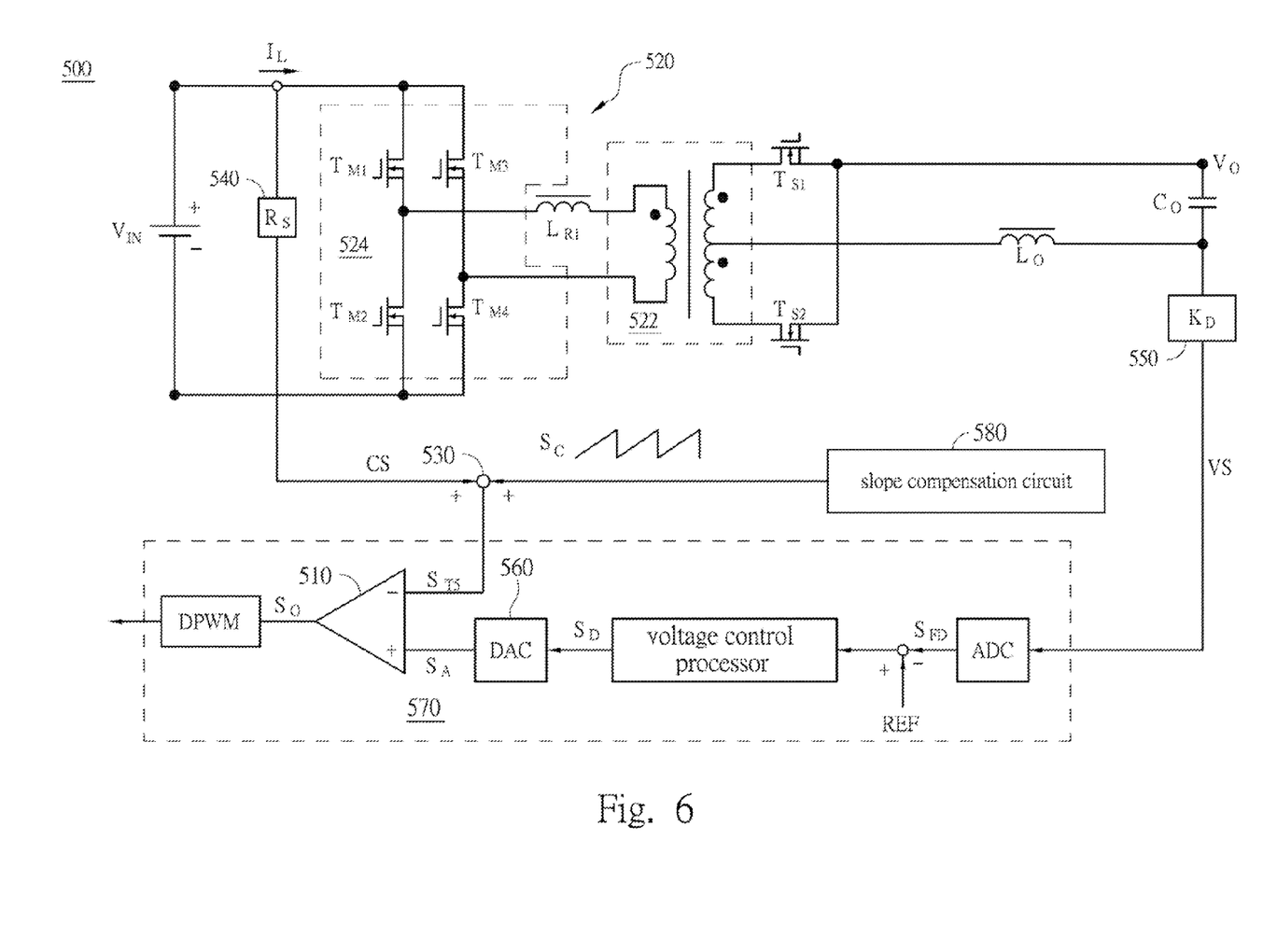
FIG. 6 schematically illustrates a converter according to a fourth embodiment of the present disclosure.

FIG. 6 schematically illustrates a converter according to a fourth embodiment of the present disclosure. As shown in FIG. 6, the converter 500 includes a converting circuit 520, a current sensing circuit 540, a digital controller circuit 570 and a slope compensation circuit 580, in which the current sensing circuit 540, the digital controller circuit 570 and the slope compensation circuit 580 may be similar to those in the aforementioned embodiments. The converting circuit 520 may be applied in the converter 100 shown in FIG. 1, the converter 300 shown in FIG. 4, and the converter 400 shown in FIG. 5, but it is not limited thereto. In one embodiment, the converting circuit 520 may be a phase-shifted full-bridge converting circuit, and the converting circuit 520 includes a full-bridge circuit 524 having switches $T_{M1}$, $T_{M2}$, $T_{M3}$ and $T_{M4}$ at a primary side of an isolation stage 522. The full-bridge circuit 524 is configured for receiving an input voltage $V_{IN}$ to generate an input current $I_L$ to be sensed by the current sensing circuit 540.

In one embodiment, the slope compensation circuit 580 is disposed outside the digital controller circuit 570 as shown in FIG. 6. In the other embodiment, the slope compensation circuit 580 is disposed in the digital controller circuit 570. Persons of ordinary skill in the art may determine the arrangement of the slope compensation circuit 580 according to practical needs.

In the present embodiment, the digital-to-analog converting circuit 560 and the comparator circuit 510 are both integrated in the digital controller circuit 570.

In another embodiment, at least one of the digital-to-analog converting circuit 560 and the comparator circuit 510 is disposed outside the digital controller circuit 570, which is not shown in FIG. 6. For example, both of the digital-to-analog converting circuit 560 and the comparator circuit 510 are disposed outside the digital controller circuit 570. For another example, the digital-to-analog converting circuit 560 may be disposed outside the digital controller circuit 570 in the condition of the comparator circuit 510 integrated inside the digital controller circuit 570, or the comparator circuit 510 may be disposed outside the digital controller circuit 570 in the condition of the digital-to-analog converting circuit 560 integrated inside the digital controller circuit 570.

Similar to the foregoing embodiments in FIG. 1, FIG. 4 and FIG. 5, in the present embodiment, the current sensing circuit 540 senses the input current $I_L$ corresponding to the input voltage $V_{IN}$ to generate a current sensing signal CS, and a summing circuit 530 generates a superimposition signal $S_{T5}$ by adding an analog slope compensation signal $S_C$ generated by the slope compensation circuit 580 to the current sensing signal CS.

In the control operation, at least one of the switches $T_{M1}$, $T_{M2}$, $T_{M3}$, $T_{M4}$, $T_{S1}$ and $T_{S2}$ in the converting circuit 520 is activated and deactivated alternately according to the comparison of the analog signal $S_A$ with the superimposition signal $S_{T5}$ by the comparator circuit 510, such that the output voltage $V_O$ of the converting circuit 520 is regulated by the operations of the switches $T_{M1}$, $T_{M2}$, $T_{M3}$, $T_{M4}$, $T_{S1}$ and $T_{S2}$.

It should be noted that the converting circuit 120 shown in FIG. 1 and the converting circuit 520 shown in FIG. 6 are merely for purposes of exemplary illustration and are not intended to limit the present disclosure; that is, the converting circuit 120 may include non-isolated converting circuits (e.g., buck converting circuits, boost converting circuits, Cuk converting circuits, buck-boost converting circuits, synchronous rectification converting circuits, diode-rectification converting circuits, etc.), and the converting circuit 520 may include isolated converting circuits (e.g., push-pull converting circuits, half-bridge converting circuits, full-bridge converting circuits, fly-back converting circuits, synchronous rectification converting circuit, diode-rectification converting circuit, etc.). In other words, without departing from the spirit and scope of the novel concepts of the present disclosure, persons skilled in the art can utilize variant non-isolated and isolated converting circuits according to practical needs.

The following description will illustrate embodiments of methods of controlling a converter for converting an input voltage $V_{IN}$ into an output voltage $V_O$ by a control operation of a converting circuit in conjunction with the converter 100 having the converting circuit 120 in FIG. 1, and it is not intended to limit the present disclosure; that is, without departing from the spirit and scope of the novel concepts of the present disclosure, the following method may be applied in the converter 300 in FIG. 4, the converter 400 in FIG. 5, the converter 500 in FIG. 6 and any other similar converters which are conceived by persons skilled in the art from the novel concepts of the present disclosure.

In one embodiment, in order to regulate the output voltage $V_O$ in a peak-current control, an output current $I_L$ corresponding to the output voltage $V_O$ is sensed by the current sensing circuit 140 to generate the current sensing signal CS. To calculate the digital signal $S_D$ correlated to the output voltage $V_O$, the digital signal $S_D$ is generated by the digital controller circuit 170 according to the voltage sensing signal VS corresponding to the output voltage $V_O$. Then, the digital signal $S_D$ is converted into the analog signal $S_A$ by the digital-to-analog converting integrated circuit 160.

Further, an analog slope compensation signal $S_C$ is exclusively generated by a slope compensation circuit 180 that is independent from the digital-to-analog converting circuit 160. To introduce the analog slope compensation signal $S_C$ into the converter 100, the analog slope compensation signal $S_C$ is superimposed on the current sensing signal CS as shown in FIG. 1.

In order to control the converter 100 by activating and deactivating a switch 121 of the converting circuit 120 with PWM techniques (i.e., pulse width modulation), the analog signal $S_A$ is compared with the superimposition of the current sensing signal CS and the analog slope compensation signal $S_C$ to generate a comparator output signal $S_O$ with PWM waveforms by a comparator circuit 110 for a control operation of the converting circuit 120.

In one embodiment, the analog slope compensation signal $S_C$ is superimposed on the current sensing signal CS by a summing circuit 130 adding the analog slope compensation signal $S_C$ to the current sensing signal CS. In one embodiment, the analog slope compensation signal $S_C$, which is added to the current sensing signal CS, is provided to an inverting input "−" of the comparator circuit 110. The analog signal $S_A$ is provided to a non-inverting input "+" of the comparator circuit 110.

In the control operation of the converting circuit 120, the comparator circuit 110 then compares the analog signal $S_A$ with the superimposition signal $S_{T1}$ to generate the comparator output signal $S_O$. Then, the SR-latch 102 receives the comparator output signal $S_O$ and a clock signal provided by the digital PWM controller 104 to generate a control signal with a duty cycle for operatively activating and deactivating the switch 121.

In addition, the analog slope compensation signal $S_C$ is characterized with an analog waveform having a charging duration $D_C$, in which the analog waveform in the duration $D_C$ has a smooth ramp without staircase patterns, to avoid instability of the converter 100.

The slope compensation circuit 180 is independent from the digital-to-analog converting circuit 160, and thus simple analog circuit designs can be realized such that the slope compensation circuit 180 and the digital-to-analog converting circuit 160 can be easily designed separately and fabricated with low cost. Therefore, the stabilization and reliability of the converter or a whole system utilizing the converter can be improved.

Referring to FIG. 3, the analog slope compensation signal $S_C$ is exclusively generated by the slope compensation circuit 280, in which the analog slope compensation signal $S_C$ in FIG. 3 may be applied in the converter 100 in FIG. 1, the converter 300 in FIG. 4, the converter 400 in FIG. 5 and the converter 500 in FIG. 6, but it is not limited thereto. In one embodiment, the switch $T_1$ is alternately deactivated so as to charge a capacitor $C_1$ and activated so as to discharge the capacitor to generate the analog slope compensation signal $S_C$ at a terminal of the capacitor $C_1$.

In another embodiment in conjunction with the embodiment shown in FIG. 5, the analog slope compensation signal $S_C$ is superimposed on the analog signal $S_A$, such that the current sensing signal CS is compared with the superimposition of the analog signal $S_A$ and the analog slope compensation signal $S_C$ by the comparator circuit 410 to generate the comparator output signal $S_O$ for a control operation of the converting circuit 120. In one embodiment, the superimposition is subtracting the analog slope compensation signal $S_C$ from the analog signal $S_A$.

Moreover, in one embodiment, the superimposition signal $S_{T4}$ which is indicated by subtracting the analog slope compensation signal $S_C$ from the analog signal $S_A$, is provided to a non-inverting input "+" of the comparator circuit 410, and the current sensing signal CS is provided to an inverting input "−" of the comparator circuit 410.

It will be apparent to those skilled in the art that various modifications and variations can be made to the structure of the present disclosure without departing from the scope or spirit of the invention. In view of the foregoing, it is intended that the present invention cover modifications and variations of this disclosure provided which fall within the scope of the following claims.

What is claimed is:

1. A converter, comprising:
  a converting circuit configured for converting an input voltage into an output voltage;

a current sensing circuit configured for sensing an input current corresponding to the input voltage or an output current corresponding to the output voltage to generate a current sensing signal;

a digital-to-analog converting circuit configured for converting a digital signal, which is generated according to the output voltage, into an analog signal;

a slope compensation circuit independent from the digital-to-analog converting circuit, the slope compensation circuit configured for generating an analog slope compensation signal exclusively to be superimposed on the current sensing signal or the analog signal; and a comparator circuit configured for comparing the analog signal with the superimposition of the analog slope compensation signal and the current sensing signal or configured for comparing the current sensing signal with the superimposition of the analog slope compensation signal and the analog signal to generate a comparator output signal for a control operation of the converting circuit.

2. The converter as claimed in claim 1, further comprising:
a digital controller circuit configured for receiving a voltage sensing signal corresponding to the output voltage and generating the digital signal in response to the voltage sensing signal.

3. The converter as claimed in claim 2, wherein the slope compensation circuit is disposed outside the digital controller circuit.

4. The converter as claimed in claim 3, wherein at least one of the digital-to-analog converting circuit and the comparator circuit is disposed outside the digital controller circuit.

5. The converter as claimed in claim 3, wherein the digital-to-analog converting circuit and the comparator circuit are integrated in the digital controller circuit.

6. The converter as claimed in claim 1, further comprising:
a summing circuit configured for adding the analog slope compensation signal to the current sensing signal and generating a superimposition signal for an inverting input of the comparator circuit.

7. The converter as claimed in claim 1, further comprising:
a subtracting circuit configured for subtracting the analog slope compensation signal from the analog signal and generating a superimposition signal for a non-inverting input of the comparator circuit.

8. The converter as claimed in claim 1, wherein the slope compensation circuit further comprises:
a capacitor having a first terminal and a second terminal, wherein the first terminal of the capacitor is configured for generating the analog slope compensation signal;
a first resistor having a first terminal and a second terminal, wherein the first terminal of the first resistor is electrically connected to the first terminal of the capacitor, and the second terminal of the first resistor is configured for receiving a power voltage;
a switch having a control terminal, a first terminal and a second terminal, wherein the control terminal of the switch is configured for receiving a synchronous signal; and
a second resistor having a first terminal and a second terminal, wherein the first terminal of the second resistor is electrically connected to the first terminal of the capacitor, and the second terminal of the second resistor is electrically connected to the second terminal of the switch.

9. A converter, comprising:
a converting circuit configured for converting an input voltage into an output voltage;
a current sensing circuit configured for sensing an input current corresponding to the input voltage or an output current corresponding to the output voltage to generate a current sensing signal;
a voltage sensing circuit configured for sensing the output voltage to generate a voltage sensing signal;
a digital controller circuit configured for receiving the voltage sensing signal and generating a digital signal in response to the voltage sensing signal;
a digital-to-analog converting integrated circuit configured for converting the digital signal into an analog signal;
a slope compensation circuit which is not integrated in the digital-to-analog converting integrated circuit and is disposed outside the digital controller circuit, the slope compensation circuit configured for generating an analog slope compensation signal exclusively to be superimposed on one of the current sensing signal and the analog signal; and
a comparator circuit configured for comparing the analog signal with the superimposition of the analog slope compensation signal and the current sensing signal or configured for comparing the current sensing signal with the superimposition of the analog slope compensation signal and the analog signal to generate a comparator output signal for a control operation of the converting circuit.

10. The converter as claimed in claim 9, wherein the digital-to-analog converting integrated circuit and the comparator circuit are integrated in the digital controller circuit.

11. The converter as claimed in claim 9, wherein the digital-to-analog converting integrated circuit and the comparator circuit are disposed outside the digital controller circuit.

12. The converter as claimed in claim 9, wherein the slope compensation circuit further comprises a capacitor and a switch alternately activated and deactivated such that the capacitor is discharged and charged alternately to generate the analog slope compensation signal.

13. The converter as claimed in claim 9, wherein the comparator circuit further comprises:
an inverting input configured for receiving a superimposition signal generated by the analog slope compensation signal added to the current sensing signal; and
a non-inverting input configured for receiving the analog signal.

14. The converter as claimed in claim 9, wherein the comparator circuit further comprises:
an inverting input configured for receiving the current sensing signal; and
a non-inverting input configured for receiving a superimposition signal generated by the analog slope compensation signal subtracted from the analog signal.

15. A method of controlling a converter for converting an input voltage into an output voltage by a control operation of a converting circuit, the method comprising:
sensing an input current corresponding to the input voltage or an output current corresponding to the output voltage to generate a current sensing signal;
generating a digital signal by a digital controller circuit according to a voltage sensing signal corresponding to the output voltage;
converting the digital signal into an analog signal by a digital-to-analog converting integrated circuit;
exclusively generating an analog slope compensation signal by a slope compensation circuit independent from the digital-to-analog converting integrated circuit;

superimposing the analog slope compensation signal on the current sensing signal or superimposing the analog slope compensation signal on the analog signal; and comparing the analog signal with the superimposition of the current sensing signal and the analog slope compensation signal or comparing the current sensing signal with the superimposition of the analog signal and the analog slope compensation signal to generate a comparator output signal by a comparator circuit for a control operation of the converting circuit.

16. The method as claimed in claim 15, wherein the step of exclusively generating the analog slope compensation signal further comprises:
alternately deactivating a switch to charge a capacitor and activating the switch to discharge the capacitor to generate the analog slope compensation signal at a terminal of the capacitor.

17. The method as claimed in claim 15, wherein the step of superimposing the analog slope compensation signal on the current sensing signal further comprises:
adding the analog slope compensation signal to the current sensing signal.

18. The method as claimed in claim 17, further comprising:
providing the current sensing signal to which the analog slope compensation signal is added, to an inverting input of the comparator circuit.

19. The method as claimed in claim 15, wherein the step of superimposing the analog slope compensation signal on the analog signal further comprises:
subtracting the analog slope compensation signal from the analog signal.

20. The method as claimed in claim 19, further comprising:
providing the analog signal from which the analog slope compensation signal is subtracted, to a non-inverting input of the comparator circuit.

* * * * *